United States Patent [19]

Kimura et al.

[11] Patent Number: 5,247,580
[45] Date of Patent: Sep. 21, 1993

[54] VOICE-OPERATED REMOTE CONTROL SYSTEM

[75] Inventors: Toshiyuki Kimura; Kazuo Yabe, both of Kawagoe, Japan

[73] Assignee: Pioneer Electronic Corporation, Tokyo, Japan

[21] Appl. No.: 917,672

[22] Filed: Jul. 22, 1992

Related U.S. Application Data

[63] Continuation of Ser. No. 578,914, Sep. 7, 1990, abandoned.

[30] Foreign Application Priority Data

Dec. 29, 1989 [JP] Japan ............... 1-341630

[51] Int. Cl.⁵ .................. G10L 5/06; G10L 3/00; H03G 3/70; H04M 11/00
[52] U.S. Cl. ..................................... 381/43; 381/41; 381/46; 381/105; 381/110; 379/102
[58] Field of Search ................... 381/41-43, 381/45-48, 104, 105, 110; 379/102

[56] References Cited

U.S. PATENT DOCUMENTS

| | | | |
|---|---|---|---|
| 4,286,115 | 8/1981 | Sakoe | 381/43 |
| 4,654,881 | 3/1987 | Dolikian et al. | 379/102 |
| 4,864,623 | 9/1989 | Van Nes et al. | 381/110 |
| 5,003,602 | 3/1991 | Koyama | 381/43 |
| 5,020,107 | 5/1991 | Rohani et al. | 381/43 |

FOREIGN PATENT DOCUMENTS 0052916 5/1981 Japan .................. 381/110

*Primary Examiner*—Dale M. Shaw
*Assistant Examiner*—Kee M. Tung
*Attorney, Agent, or Firm*—Sughrue, Mion, Zinn, Macpeak & Seas

[57] ABSTRACT

A voice-operated remote control system which transmits a remote control signal in response to a voice command has a degree-of-importance determining unit for determining the degree of importance of the voice command that is applied to the remote control system. The degree-of-importance determining unit sends a degree-of-importance signal corresponding to the degree of importance of the voice command to a recognition accuracy determining unit. Depending on the degree of importance of the input voice command as indicated by the degree-of-importance signal, the recognition accuracy determining unit determines whether the accuracy of the recognition result is high or low, and delivers only the recognition result of higher recognition accuracy to a transmitting circuit.

5 Claims, 11 Drawing Sheets

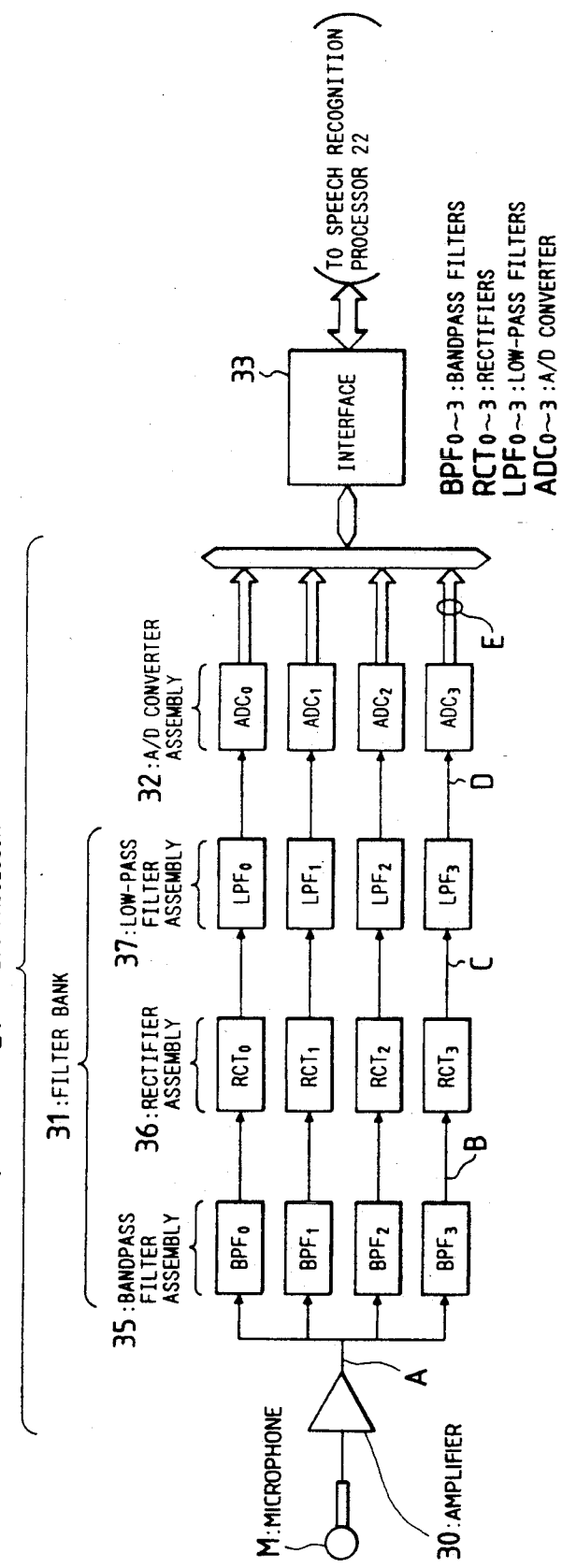
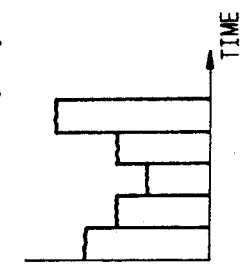
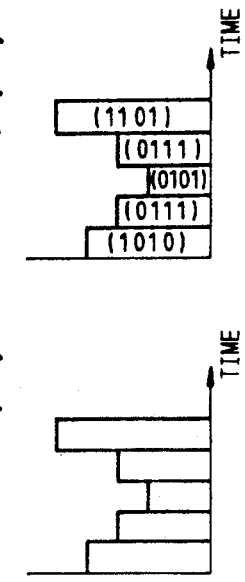
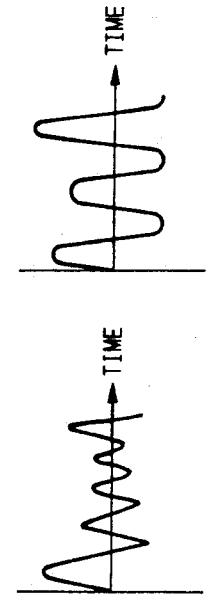
FIG. 9(a)    FIG. 9(b)    FIG. 9(c)    FIG. 9(d)    FIG. 9(e)    FIG. 9(f)

VOICE-OPERATED REMOTE CONTROL SYSTEM

This is a continuation of application Ser. No. 07/578,914 filed Sep. 7, 1990 now abandoned.

BACKGROUND OF THE INVENTION

The present invention relates to a remote control system for remotely controlling various electronic devices, and more particularly to a remote control system for remotely controlling devices such as AV (audio visual) devices by way of voice commands.

In recent years, various AV devices such as stereo sets, television receivers, cassette tape decks, video tape decks, compact disk players, laser vision disk players, or the like are equipped with remote control systems.

A remote control system has a transmitter which is usually positioned remotely from a controlled AV device. The transmitter, when operated, transmits a remote control signal, such as an infrared remote control signal, which is received by a receiver in the controlled AV device. The received remote control signal is decoded to control the AV device as intended by the remote control signal.

There has recently been developed a voice-operated remote control commands entered through keys. The voice-operated remote control system has a microphone mounted on a transmitter for converting a voice command into an electric voice signal, and a speech recognition LSI (Large Scale Integration) circuit for generating a remote control signal which corresponds to a voice pattern represented by the voice signal. The remote control signal thus generated is transmitted to a receiver in a controlled AV device.

In the conventional voice-operated remote control system, a remote control signal corresponding to the recognition result of a speech recognition process is transmitted as it is.

The degrees of importance of operations of a controlled device which correspond to respective remote control signals, i.e., the magnitudes of effects caused by erroneous recognition, may not necessarily be the same. For example, any trouble caused by erroneous recognition of a voice command is greater with respect to a recording operation than a reproducing operation. If control commands are handled with suitable different degrees of importance depending on the type of the control commands rather than with the same degree of importance, then the speech recognition can be processed highly efficiently, and more reliability can be achieved for more important control commands.

SUMMARY OF THE INVENTION

It is an object of the present invention to provide a voice-operated remote control system which can vary a speech recognition process depending on the degree of importance of a control command.

According to the present invention, there is provided a voice-operated remote control system comprising a microphone for entering a voice command, speech recognition means for comparing a pattern of the entered voice command with a predetermined standard pattern to recognize the contents of the voice command, transmitting means for generating and transmitting a remote control signal corresponding to the command data based on the result of recognition, degree-of-importance determining means for determining the degree of importance of the contents of the voice command to produce a degree-of-importance signal, and recognition accuracy determining means for determining the accuracy of the result of recognition of the voice command depending on the degree of importance thereof as indicated by the degree-of-importance signal, and for sending only a result of recognition which has a relatively high accuracy of recognition to the transmitting means.

The speech recognition means effects a speech recognition process through comparison between a pattern of a voice command entered through the microphone and a standard pattern. The degree-of-importance determining means determines the degree of importance of the voice command based on the result of recognition. The degree of importance thus determined is given to the recognition accuracy determining means, which determines the accuracy of the recognition result depending on the determined degree of importance of the voice command. For example, a level for determining the accuracy of recognition for a voice command of higher importance is higher, and a level for determining the accuracy of recognition for a voice command of lower importance is lower. The recognition accuracy determining means delivers only a recognition result of a higher recognition accuracy to the transmitting means. Therefore, only the recognition result which is of higher importance and higher recognition accuracy is converted into a remote control signal by the transmitting means for transmission to a remotely controlled device. Accordingly, an erroneous operation of the remotely controlled device due to erroneous recognition is prevented from happening.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 9($a$) is a diagram showing an analog processor;

FIGS. 9($b$) through 9($f$) are diagrams showing the waveforms of signals in the analog processor shown in FIG. 9($a$);

DETAILED DESCRIPTION OF THE INVENTION

General Remote Control System

For a better understanding of the present invention, a general remote control system and a voice remote control system will first be described below.

Figure 1:
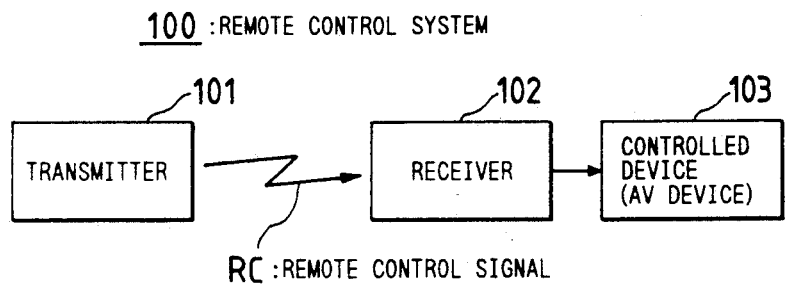
FIG. 1 is a block diagram of a general remote control system.

As shown in FIG. 1, a remote control system 100 comprises a transmitter 101 for transmitting a remote control signal from a position remote from a controlled device 103 such as an AV device, and a receiver 102 for receiving the transmitted remote control signal, decoding the remote control signal, and sending the decoded information to the controlled device 103.

Figure 2:
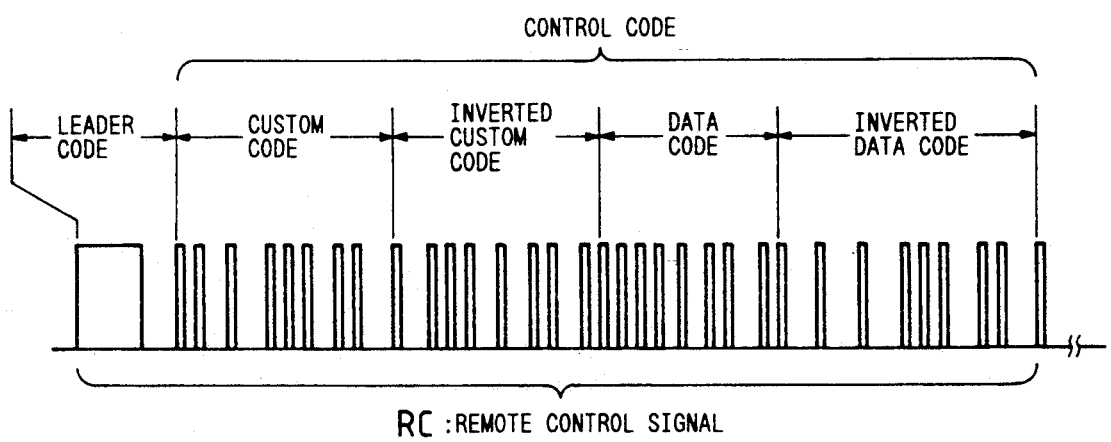
FIG. 2 is a diagram showing a remote control signal by way of example.

FIG. 2 shows a general remote control signal. The remote control signal is composed of a leader code which indicates the transmission of data to a receiver, a custom code and an inverted custom code which indicate a controlled device, a data code and an inverted data code which indicate a control command for the controlled device. The inverted custom code and the inverted data code are used to detect any error in the custom code and the data code, respectively.

Figure 3:
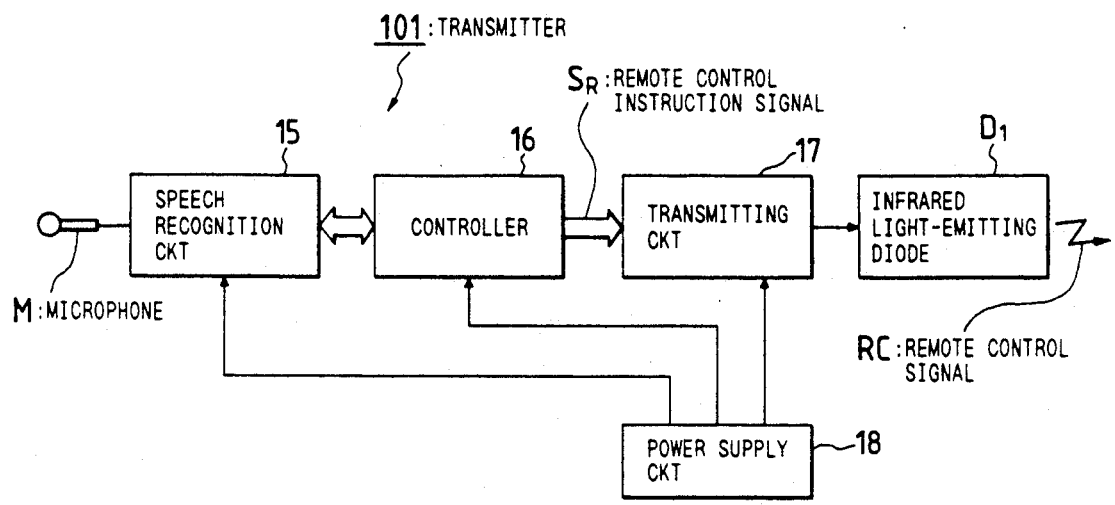
FIG. 3 is a block diagram of the transmitter of a general voice-operated remote control system.

FIG. 3 schematically shows the transmitter 101 of the voice-operated remote control system 100. The transmitter 101 has a microphone M for converting a voice command into an electric signal. The converted electric signal is applied to a speech recognition circuit 15 in the form of a speech recognition LSI circuit or the like which includes a microprocessor. The speech recognition circuit 15 recognizes the contents of the applied electric signal, and produces command data corresponding to the recognized contents. The transmitter 101 also has a controller 16 comprising a microprocessor. Based on the command data from the speech recognition circuit 15, the controller 16 produces and applies a remote control instruction signal SR to a transmitting circuit 17, which then energizes an infrared light-emitting diode D1 to transmit a remote control signal RC. The above components of the transmitter 101 are supplied with electric energy from a power supply circuit 18.

When a voice command is received through the microphone M, the speech recognition circuit 15 converts the voice command into pattern data. The speech recognition circuit 15 compares the voice command pattern data with a plurality of standard pattern data which are stored therein, and determines the distance between the voice command data and the standard pattern data, and outputs command data corresponding to the standard pattern data, the distance of which from the voice command pattern data is smallest. There may also be employed another speech recognition process in which the similarity of the compared pattern data is determined according to a known simple similarity method and command data corresponding to the standard pattern data which has the highest similarity are outputted. The command data thus produced are applied to the controller 16.

The controller 16 sends a remote control signal SR corresponding to the applied command data to the transmitting circuit 17. In response to the supplied remote control instruction signal SR, the transmitting circuit 17 drives the infrared light-emitting diode D1 to transmit a remote control signal RC. The controlled device 103 is therefore remotely controlled by the remote control signal RC.

First Embodiment

A voice-operated remote control system according to a first embodiment of the present invention will now be described below with reference to FIGS. 4 through 10.

[External Structure]

Figure 4:
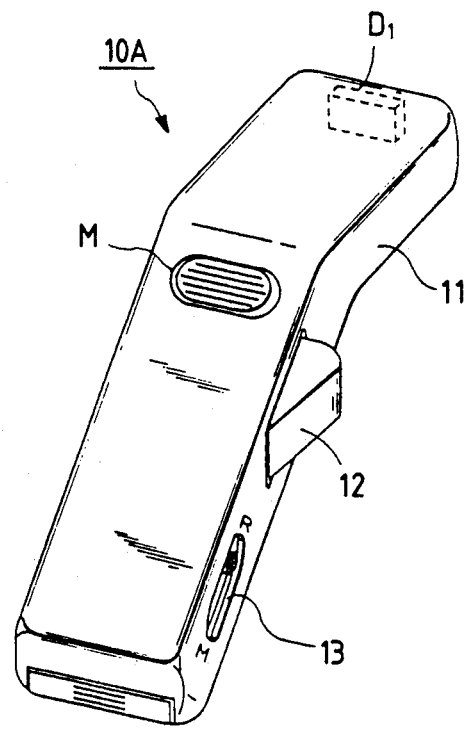
FIG. 4 is a perspective view of the transmitter of a voice-operated remote control system according to a first embodiment of the present invention.

As shown in FIG. 4, a transmitter 10A of the voice-operated remote control system has a unitary casing 11 which allows the operator to carry the transmitter freely around. The casing 11 supports a microphone M on an upper panel thereof. The microphone M converts a voice command given by the operator into an electric signal. An infrared light-emitting diode D1, for example, is mounted in one end of the casing 11. The infrared light-emitting diode D1 is used to transmit a remote control signal to the receiver of a remotely controlled device (not shown). On one side of the casing 11, there is disposed a voice input switch (hereinafter referred to as a "talk switch") 12 which is closed when pressed and can automatically be released or opened when released. The talk switch 12 may be an automatic-return pushbutton switch or a slide-type switch. When a voice command is to be entered, the talk switch 12 is closed to operate the transmitter 10A. Otherwise, the talk switch 12 is open keeping the transmitter 10A out of operation. The casing 11 also supports, on its side, a mode selector switch 13 in the form of a slide-type switch, for example. The mode selector switch 13 serves to select one of modes at a time. The modes include a speech registration mode in which a voice command is registered in the transmitter 10A and a speech recognition mode in which a voice command is recognized, as described later on. The casing 11 accommodates therein an electronic circuit of the voice-operated remote control system according to the present invention.

Electronic Circuit Structure

Figure 5:
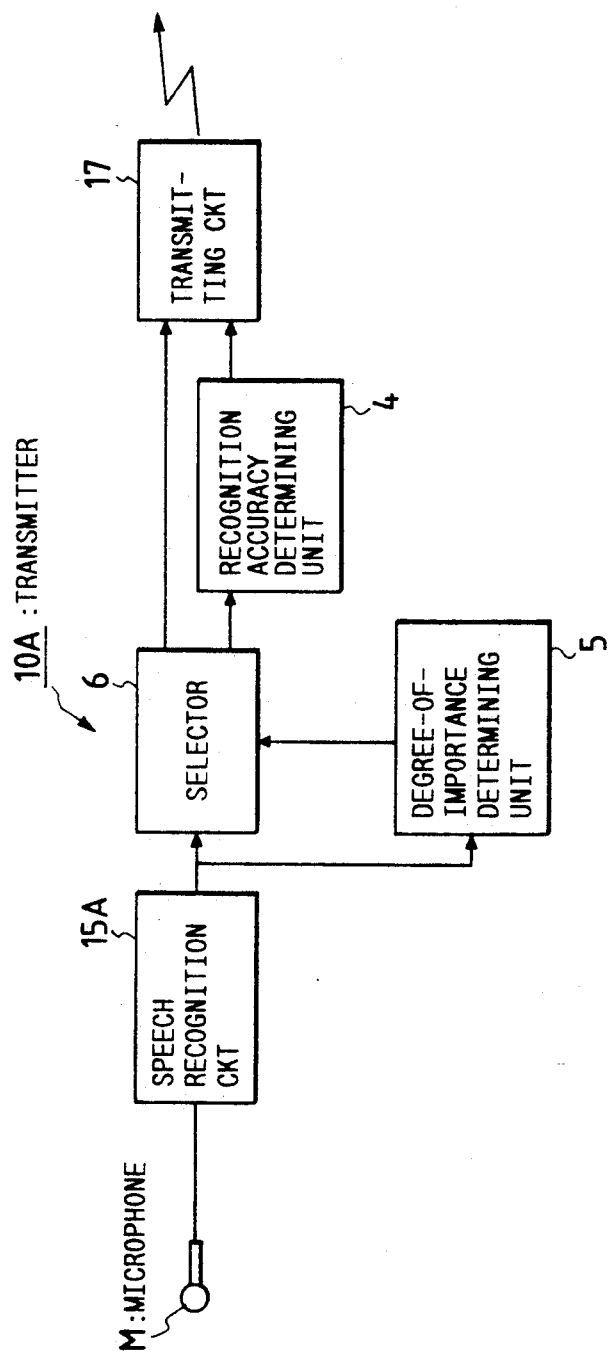
FIG. 5 is a block diagram of the transmitter of the voice-operated remote control system according to the first embodiment.

FIG. 5 shows in block form the electronic circuit of the transmitter 10A of the voice-operated remote control system according to the present invention. The transmitter 10A has a speech recognition circuit 15A for recognizing a voice command entered from a microphone M according to the pattern recognition process, a degree-of-importance determining unit 5 for determining the degree of importance of a recognized voice command, a selector 6 for selecting circuits or destinations to which an output signal from the speech recognition unit 15A is to be sent, depending on the determined degree of importance, a recognition accuracy determining unit 4 for determining the accuracy of recognition of a voice command which has a high degree of importance, and a transmitting circuit 17 for converting recognized voice command data into a remote control signal RC and transmitting the remote control signal RC.

Figure 6:
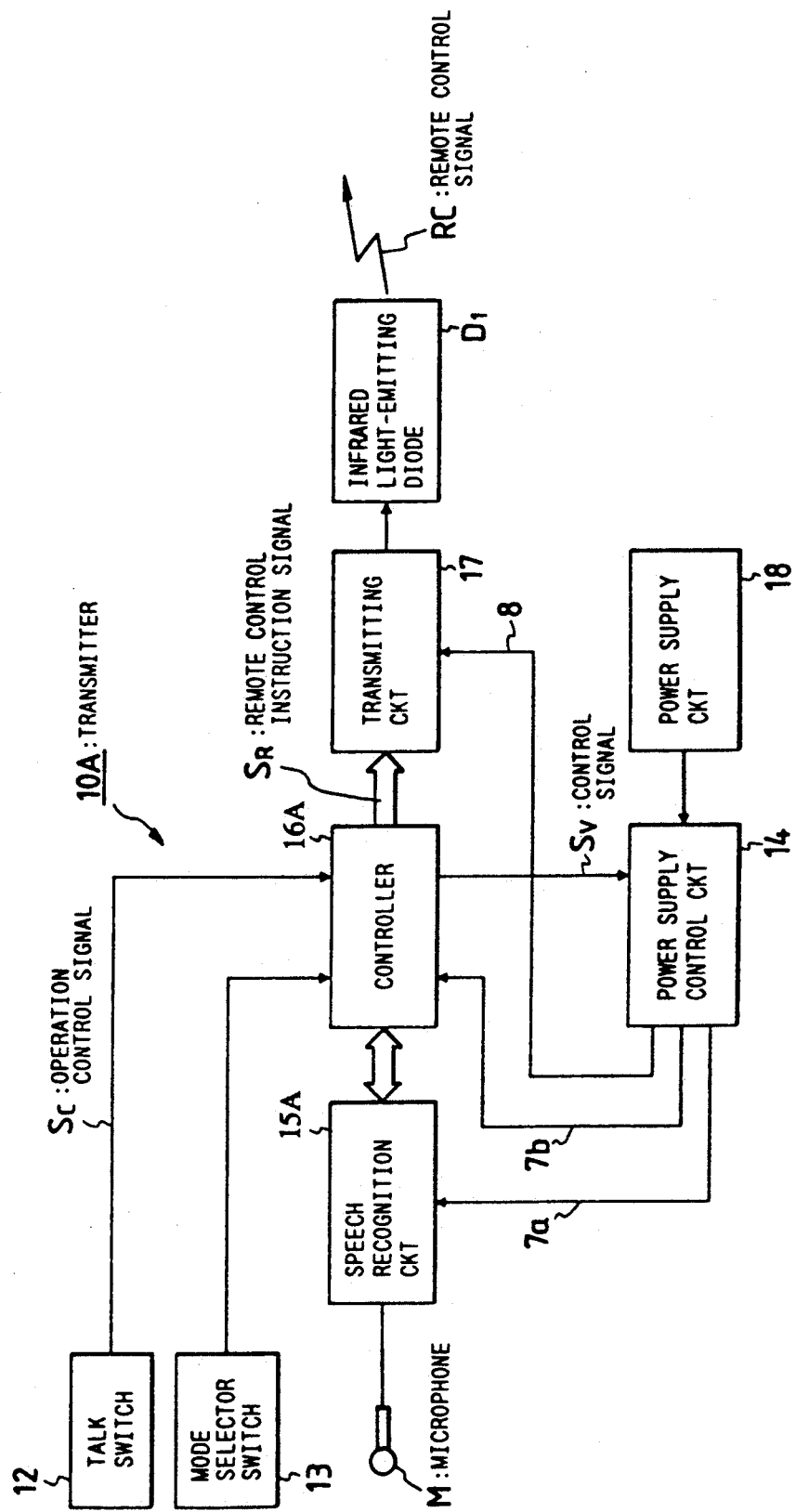
FIG. 6 is a detailed block diagram of the transmitter according to the first embodiment.

As shown in FIG. 6, the transmitter 10A has a controller 16A to which the talk switch 12 and the mode selector switch 13 are connected. The controller 16A applies a remote control instruction signal SR to the transmitting circuit 17 which energizes the infrared light-emitting diode D1 to transmit a remote control signal RC to the receiver of a remotely controlled device. The speech recognition circuit 15A, the controller 16A, and the transmitting circuit 17 are supplied with electric energy from a power supply circuit 18 through a power supply control circuit 14 and power supply wires.

Figure 7:
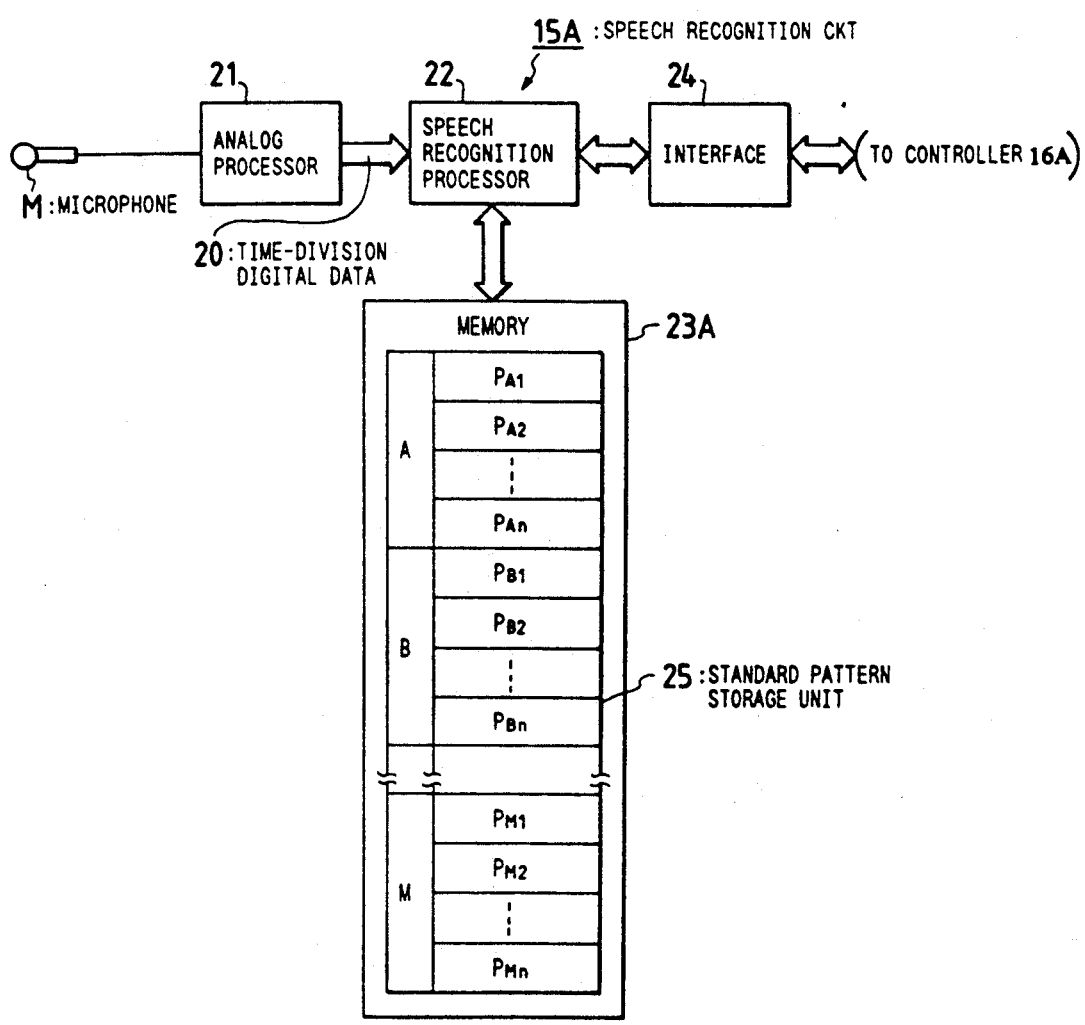
FIG. 7 is a block diagram of a speech recognition circuit according to the first embodiment.

As shown in FIG. 7, the speech recognition circuit 15A comprises an analog processor 21 for processing an analog voice command signal which is received through the microphone M and outputting the processed analog voice command signal as a time-division digital data 20, a speech recognition processor 22 for recognizing the voice command based on the time-division digital data 20 from the analog processor 21, a memory 23A for storing standard pattern data for speech recognition, and an interface 24 for transmitting signals to and receiving signals from the controller 16A.

The memory 23A includes a standard pattern data storage unit 25 which stores a plurality of different standard pattern data PA1 through PAn, PB1 through PBn, ..., PM1 through PMn with respect to respective voice commands.

Figure 8:
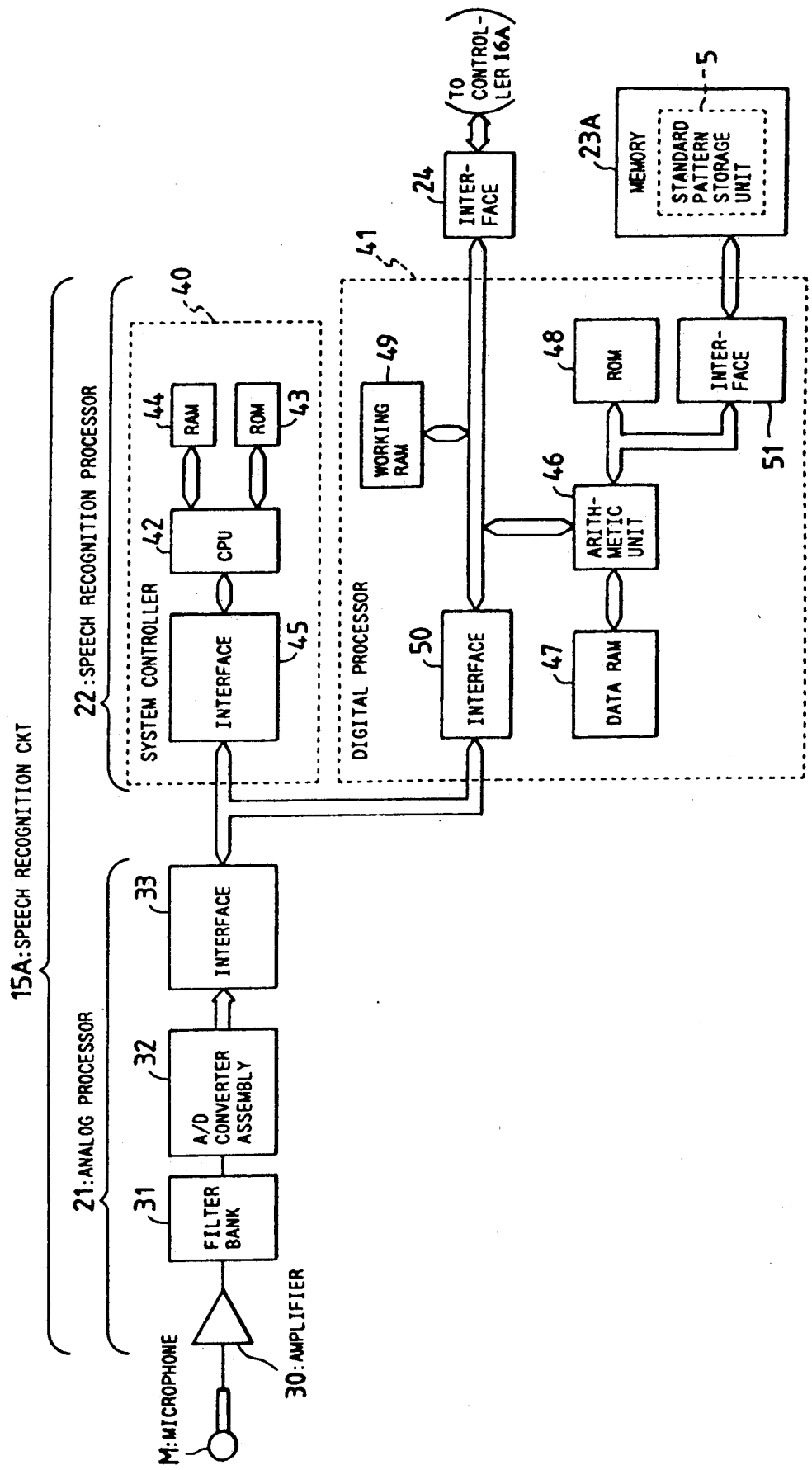
FIG. 8 is a detailed block diagram of the speech recognition circuit according to the first embodiment.

As shown in FIG. 8, the analog processor 21 generally comprises an amplifier 30 for amplifying a voice command signal transmitted from the microphone M to a suitable level, a filter bank 31 for dividing an amplifier output signal into signals in different frequency bands and rectifying and outputting the signals in these different frequency bands, an analog-to-digital converter assembly (hereinafter referred to as an "A/D converter assembly") 32 for converting the output signals in the different frequency bands from the filter bank 31 into digital signals, and an interface 33 for transmitting signals to and receiving signals from the speech recognition processor 22.

As shown in FIG. 9(a), the filter bank 31 comprises a bandpass filter assembly 35 for dividing the input voice signal into signals in a plurality of frequency bands (four frequency bands in FIG. 9(a)), a rectifier assembly 36 for rectifying output signals from the bandpass filter assembly 35, and a low-pass filter assembly 37 for removing ripples from output signals from the rectifier assembly 36.

The bandpass filter assembly 35 comprises a plurality of (four in FIG. 9(a)) bandpass filters PBF0 through BPF3 which have respective central frequencies f0, f1, f2, f3 (f0<f1< f2<f3) corresponding to the frequency bands.

The rectifier assembly 36 comprises four rectifiers RCT0 through RCT3 connected in series with the bandpass filters BPF0 through BPF3 of the bandpass filter assembly 35, respectively. The rectifiers RCT0 through RCT3 rectify the output signals from the band pass filters BPF0 through BPF3 in the respective frequency bands.

The low-pass filter assembly comprises four low-pass filters LPF0 through LPF3 connected in series with the rectifiers RCT0 through RCT3 of the rectifier 36, respectively. The low-pass filters LPF0 through LPF3 remove ripples from the rectified signals in the respective frequency bands.

The A/D converter assembly 32 comprise four A/D converters ADC0 through ADC3 connected in series with the low-pass filters LPF0 through LPF3 of the low-pass filter assembly 37, respectively. The A/D converters ADC0 through ADC3 convert the analog output signals from the low-pass filters LPF0 through LPF3 into digital signals.

Operation of the analog processor 21 will be described below. For the sake of brevity, only signal processing in one frequency band (e.g., through the band pass filter PBF3) will be described. However, similar signal processing is carried out in the other frequency bands.

When a voice command is applied to the microphone M, the output electric signal from the microphone M is amplified to a suitable signal level by the amplifier 30, which outputs an amplified signal A (see FIG. 9(b)). The amplified signal A is applied to the band passes filter PBF3, which then passes only a signal B in its passband. The signal B is then applied to the rectifier RCT3 (see FIG. 9(c)). The signal B is rectified by the rectifier RCT3, and a rectified output signal C (FIG. 9(d)) from the rectifier RCT3 is transmitted to the low-pass filter LPF3. The low-pass filter LPF3 removes ripples which may be contained in the signal C, and produces a ripple-free output signal D (see FIG. 9(e)) which is then inputted to the A/D converter ACD3. The A/D converter ADC3 then converts the supplied input signal D into a signal E composed of 4-bit time-division digital data (1010), (0111), (0101), (0111), (1101), ..., as shown in FIG. 9(f).

As illustrated in FIG. 8, the speech recognition processor 22 comprises a system controller 40 for analyzing and processing control commands from the controller 16 and also for controlling the entire operation of the speech recognition processor 22, and a digital processor 41 for effecting distance calculations and controlling the memory 23A.

The system controller 40 comprises a CPU (Central Processing Unit) 42 for controlling the overall operation of the transmitter 1, a ROM (Read-Only Memory) 43 for storing a control program to be executed by the CPU 42 for the overall operation of the transmitter 101, a RAM (Random-Access Memory) 44 for temporarily storing data, and an interface 45 for transmitting data to and receiving data from the analog processor 21 and the digital processor 41.

The digital processor 41 comprises an arithmetic unit 46 for effecting distance calculations and identifying input voice commands based on the results of the distance calculations, a data RAM 47 for storing data necessary for distance calculations, a ROM 48 for storing a program for distance calculations, a working RAM 49 for temporarily storing processed data, an interface 50 for transmitting data to and receiving data from the analog processor 21 and the system controller 40, and an interface 51 for transmitting data to and receiving data from the memory 23A.

The speech recognition processor 22 operates as follows: When a control command is applied from the controller 16 through the interface 24 to the speech recognition processor 22, the system controller 40 receives the control command through the interfaces 50, 45 and analyzes the received control command. If the result of analysis indicates a speech recognition process, the system controller 40 sends an instruction for speech recognition to the digital processor 41 through the interfaces 45, 50.

When instructed by the system controller 40, the digital processor 41 introduces time-division digital data (input voice command signal) 20 from the analog processor 21 through the interface 50 into the data RAM 47. The arithmetic unit 46 reads the standard pattern data from the first address in the memory 23A which stores the different standard pattern data PA1 through PAn, ..., PM1 through PMn, through the interface 51. Then, the arithmetic unit 46 determines the logarithm of the first time-division digital data of a plurality of time-division digital data which constitute one of the read standard pattern data and also the logarithm of the first time-division digital data of the input voice command signal, and then determines the differences between the logarithms. The arithmetic unit 46 further squares the differences, and adds the squares to determine a distance D. Therefore, the distance D is given by:

$$D = \sum_{t=0}^{x} (\log(f(t)) - \log(fs(t)))^2$$

where
x: the number of time divisions;
f(t): the input voice command data (time-division digital data); and
fs(t): the standard pattern data (time-division digital data).

Likewise, the distances D are calculated in the same manner for all the standard pattern data. The smaller the calculated distances, the higher the probability that the standard pattern data are similar to the voice command. The recognition results thus obtained are collected for each of the voice commands. Then, command data corresponding to the voice command to which the standard pattern data are most similar as a whole are outputted as command data from the speech recognition circuit 15A through the interface 24 to the controller 16A.

Referring back to FIG. 6, the controller 16A is in the form of a microprocessor, for example. The microprocessor of the controller 16A comprises a CPU, a ROM, a RAM, and an interface. The CPU executes arithmetic operations while referring to data stored in the RAM, which serves as a working memory, according to the algorithm (see FIG. 10) of a control program stored in the ROM, for thereby effecting the overall operation of the transmitter 10A. The controller 16A also receives signals from the talk switch 12 and the mode selector switch 13 as interrupt signals, and effects control functions according to commands indicated by these interrupt signals. Operation of the transmitter 10A under the control of the controller 16A will be described below.

The controller 16A implements the recognition accuracy determining unit 4, and the selector 6 according to a program. Specifically, the degree-of-importance determining unit 5 and the selector 6 are implemented by a step S17 in FIG. 10, and the recognition accuracy determining unit 4 is implemented by steps S16, S18, S19 in FIG. 10.

Overall Operation

The transmitter 10A operates depending on whether the talk switch 12 is pressed or released (i.e., turned on or off). If the talk switch 12 is pressed, the transmitter 10A is capable of transmitting remote control signals, and if the talk switch 12 is released, the transmitter 10A is kept in the low power consumption mode, waiting for voice commands to be applied. There are two input modes for entering voice commands. In one input mode, voice commands of the operator are registered, and in the other input mode, voice commands of the operator are recognized. In the voice registration mode, a command word such as for "reproduction" is recorded in the transmitter 10A.

Figure 10:
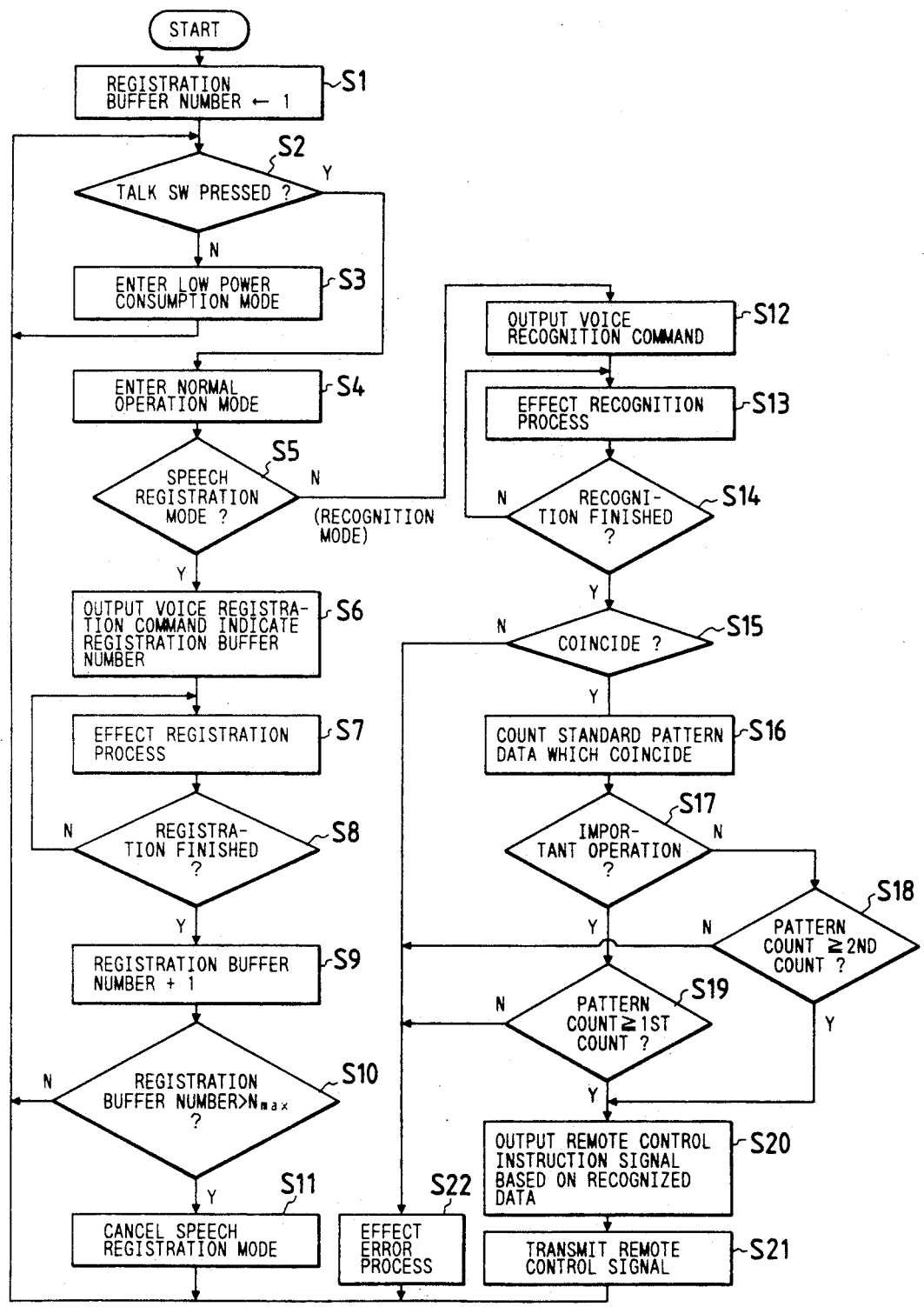
FIG. 10 is a flowchart of an operation sequence of the transmitter according to the first embodiment.

Now, operation of the transmitter 10A will be described below with reference to the flowchart of FIG. 10. It is assumed that the talk switch 12 is not pressed and the transmitter 10A is in a standby condition in the low power consumption mode.

First, the controller 16A initializes a registration buffer number to 1 in a step S1.

Then, the controller 16A detects whether the talk switch 12 is pressed or not in a step S2 by detecting whether there is produced an operation control signal Sc from the talk switch 12 or not. If the talk switch 12 is pressed, it produces an operation control signal Sc, and the controller 16A sends a control signal Sv to the power supply control circuit 14. The power supply control circuit 14 supplies electric energy in a normal mode, enabling the transmitter 10A in a step S4.

If the talk switch 12 is not pressed, the transmitter 1 is left in the low power consumption mode, and the steps S2 and S3 are repeated.

Thereafter, the controller 16A reads the condition of the mode selector switch 13 to determine whether or not it indicates the speech registration mode for voice commands to generate standard pattern data in a step S5.

If the speech registration mode is indicated, control then goes to a step S6 in which the controller 16A outputs a command to instruct the speech recognition circuit 15A to carry out a speech registration process. At the same time, the controller 16A sends a registration buffer number to the speech recognition circuit 15A in the step S6.

The speech recognition circuit 15A then stored speech recognition standard pattern data in a corresponding registration buffer in the memory 23A, i.e., a registration buffer having the registration buffer number = 1, in a step S7.

The controller 16A reads a status register (not shown) in the speech recognition circuit 15A to determine whether the registration of a voice command is finished or not in a step S8. If the registration is not yet finished, then the steps S7 and S8 are repeated until the registration is finished. If the registration is finished, the registration buffer number is incremented by 1 in a step S9.

Then, the controller 16A determines whether the current registration buffer number has exceeded a maximum number Nmax that can be registered or not in a step S10. If not, then control returns to the step S2. If exceeded, the controller 16A sends a command to cancel the speech registration mode to the speech recognition circuit 15A, thereby canceling the speech registration mode in a step S11. Then, control goes back to the step S2.

If the speech registration mode is not indicated by the mode selector switch 13 in the step S5, i.e., if the speech recognition mode is indicated by the mode selector switch 13 in the step S5, then the controller 16A outputs a speech recognition command to the speech recognition circuit 15A in a step S12. The speech recognition circuit 15A now effects a speech recognition process as described above in a step S13.

The controller 16A reads a status register (not shown) in the speech recognition circuit 15A to determine whether the speech recognition is finished or not in a step S14. If the speech recognition is not yet finished, then the steps S13 and S14 are repeated until the speech recognition is finished. If the speech recognition is finished, then the controller 16A determines whether the input voice command data and the standard pattern data coincide with each other, i.e., the distance D falls within a predetermined distance, or not in a step S15. If the input voice command data and the standard pattern data coincide with each other, then the controller 16A counts the number of standard pattern data which agree with the recognition result, among all the standard pattern data corresponding to the recognition result, in a step S16. The count is referred to as a pattern count which is used as a level to determine the accuracy of recognition.

Then, the controller 16A determines whether the recognition result indicates an important operation or not in a step S17. If not, the controller 16A determines whether or not the pattern count is equal to or greater than a predetermined second count in a step S18. The second count corresponds to a condition in which the same recognition result is obtained using more than half standard pattern data, and represents a relatively low accuracy of recognition. If the pattern count is lower than the second count, then since the input voice command cannot be recognized due to the low recognition accuracy, control goes to a step S22 for an error process. If the pattern count is equal to or greater than the second count, then since the recognition accuracy is relatively high and the recognition process is reliable, the controller 16A produces a remote control instruction signal SR based on the recognized voice command data and sends the remote control instruction signal SR to the transmitting circuit 17 in a step S20.

If the recognition result indicates an important operation in the step S17, then the controller 16A determines whether or not the pattern count is equal to or greater than a predetermined first count in a step S19. The first count represents a relatively high degree of recognition and corresponds to a condition in which the same recognition result is obtained using 90 percent or more of the standard pattern data. For control commands of high importance, in order to maintain control reliability, no remote control signal RC is generated unless the condition of the step S19 is met.

The controller 16A produces a remote control instruction signal SR based on the recognized voice command data of high recognition accuracy and sends the remote control instruction signal SR to the transmitting circuit 17 in the step S20. In response to the remote control instruction signal ST, the transmitting circuit 17 transmits a corresponding remote control signal RC in a step S21. If the input voice command data and the standard pattern data do not coincide with each other in the step S15, or the pattern count is smaller than the second count in the step S18, or smaller than the first count in the step S19, then the controller 16A effects an error process such as the generation of a buzzer sound in the step S22, and control goes back to the step S2.

In the first embodiment of the present invention, as described above one voice command is recognized using a plurality of different standard pattern data PA 1 through PAn, PB1 through PBn, ... PM1 through PMn for respective voice commands, and if the recognition result indicates an important operation, then the recognition accuracy is confirmed to lower the erroneous recognition rate.

Second Embodiment

A voice-operated remote control system according to a second embodiment of the present invention will be described below with reference to FIGS. 11 through 13.

External Structure

The voice-operated remote control system according to the second embodiment has a transmitter which has the same external structure as that of the transmitter 10A shown in FIG. 4.

Electronic Circuit Structure

Figure 11:
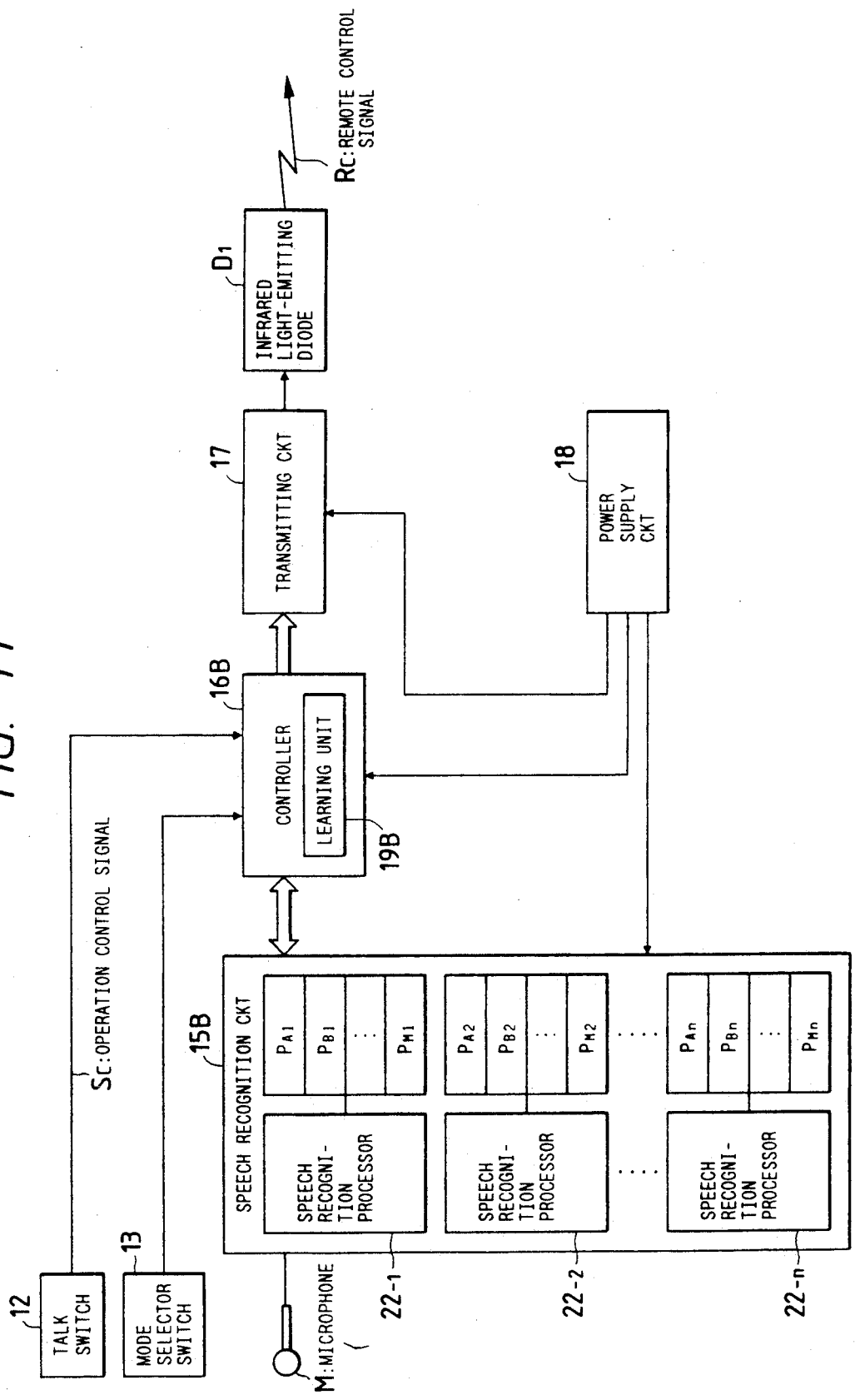
FIG. 11 is a block diagram of the transmitter of a voice-operated remote control system according to a second embodiment of the present invention.
Figure 12:
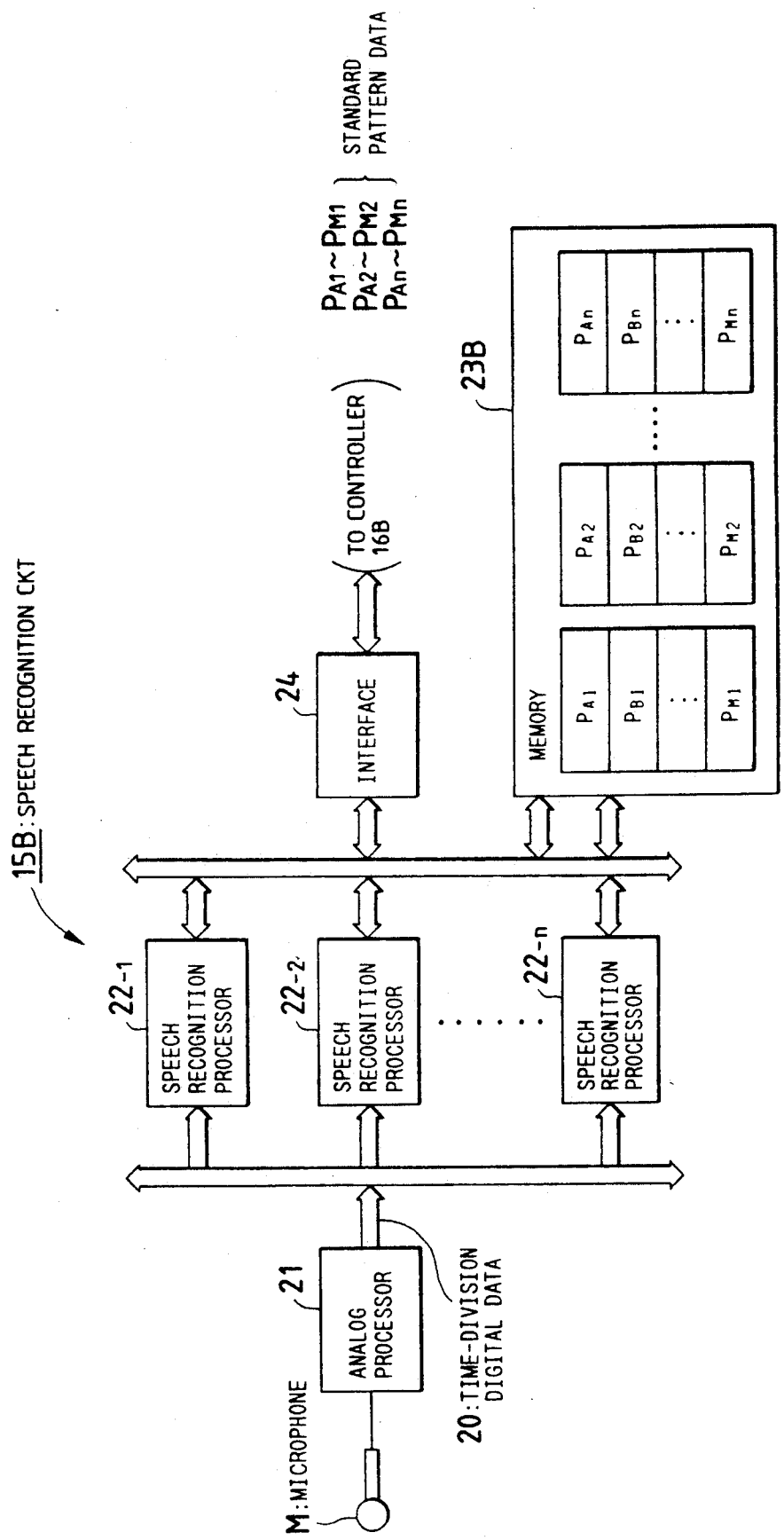
FIG. 12 is a block diagram of a speech recognition circuit according to the second embodiment.

The transmitter, generally indicated at 10B, of the voice-operated remote control system according to the second embodiment is shown in FIGS. 11 and 12. Those parts shown in FIG. 11 which are identical to those shown in FIG. 6 are denoted by identical reference numerals, and will not be described in detail.

The transmitter 10B has a speech recognition circuit 15B which, as shown in FIG. 12, comprises an analog processor 21 for processing an analog voice command signal which is received through the microphone M and outputting the processed analog voice command signal as a time-division digital data 20, a plurality of parallel speech recognition processors 22-1 through 22-n for independently recognizing the voice command based on the time-division digital data 20 from the analog processor 21, a memory 23B for storing standard pattern data for speech recognition by the speech recognition processors 22-1 through 22-n, respectively, and an interface 24 for transmitting signals to and receiving signals from a controller 16B.

The speech recognition processors 22-1 through 22-n use respective standard pattern data with respect to each voice command, and effect independent speech recognition processes. For example, the speech recognition processor 22-1 uses standard pattern data PA1, PB1, ... PM1, and the speech recognition processor 22-2 uses standard pattern data PA2, PB2, ... PM2.

The memory 23B has address areas allotted to the respective speech recognition processors 22-1 through 22-n, and stores standard pattern data PA1 through PM1, PA2 through PM2, ..., PAn through PMn.

These standard pattern data may be stored in different areas in the memory 23B as described above, or may be stored in respective memories associated with the respective speech recognition processors.

The controller 16B has the functions of the recognition accuracy determining unit 4, the degree-of-importance determining unit 5, and the selector 6 according to the first embodiment. More specifically, if the control command indicated by the recognition result giving by the speech recognition circuit 15B is determined to be of high importance, then the controller 16B collects the recognition result of the speech recognition processors 22-1 through 22-n, and outputs only the recognition result of high recognition accuracy as command data. If any recognition result which meets the degree of importance of the control command is not obtained, then the controller 16B not output any command data. The recognition accuracy determining unit 4 is implemented by steps S50, S51 in FIG. 13, and the degree-of-importance determining unit 5 and the selector 6 are implemented by a step S49 in FIG. 13.

The analog processor 21, the speech recognition processors 22-1 through 22-n, and the interface 24 shown in FIG. 12 and the other structural details shown in FIG. 11 are identical to those according to the first embodiment.

Overall Operation

The transmitter 10B according to the second embodiment operates as follows: It is assumed that the talk switch 12 is not pressed and the transmitter 10B is in a standby condition.

Figure 13:
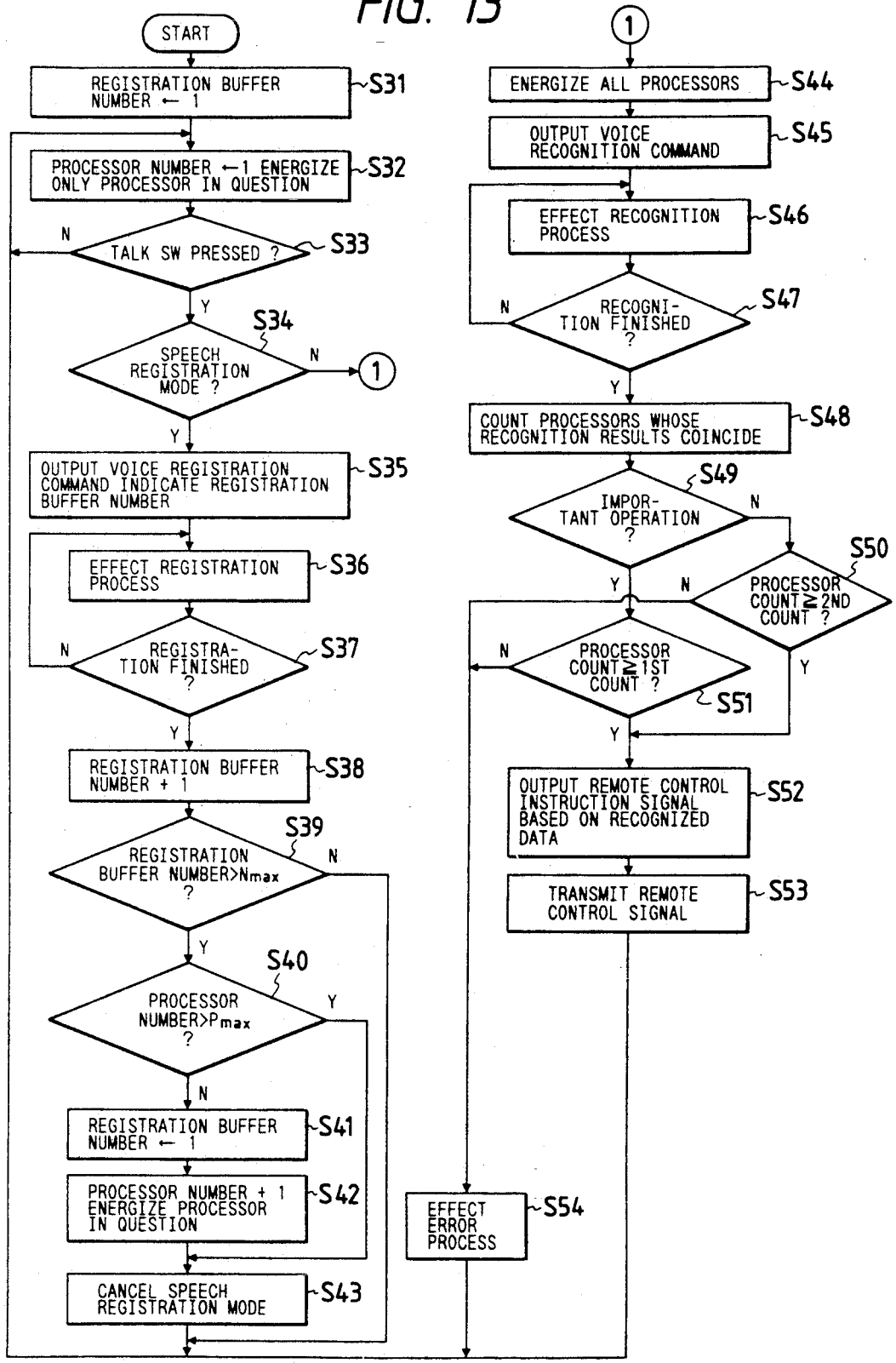
FIG. 13 is a flowchart of an operation sequence of the transmitter according to the second embodiment.

First, the controller 16B initializes a registration buffer number to 1 in a step S31 (FIG. 13). The processor number is set initialized to 1, and the speech recognition processor corresponding to that processor number, e.g., the speech recognition processor 22-1, is enabled in a step S32.

Then, the controller 16B detects whether the talk switch 12 is pressed or not in a step S33 by detecting whether there is produced an operation control signal Sc from the talk switch 12 or not. If the talk switch 12 is pressed, then an operation control signal Sc is produced, and the controller 16B enables the transmitter 10B to receive a voice command.

Thereafter, the controller 16B reads the condition of the mode selector switch 13 to determine whether it indicates the speech registration mode for voice commands to generate standard pattern data or not in a step S34.

If the speech registration mode is indicated, control then goes to a step S35 in which the controller 16B outputs a command to instruct the speech recognition circuit 15B to carry out a speech registration process. At the same time, the controller 16B sends a registration buffer number to the speech recognition circuit 15B in the step S35.

The speech recognition circuit 15B then stores speech recognition standard pattern data in a corresponding registration buffer for the speech recognition processor in question in the memory 23B, i.e., a registration buffer having the registration buffer number = 1, in a step S36.

The controller 16B reads a status register (not shown) in the speech recognition circuit 15B to determine whether the registration of a voice command is finished or not in a step S37. If the registration is not yet finished, then the steps S36 and S37 are repeated until the registration is finished. If the registration is finished, the registration buffer number is incremented by 1 in a step S38.

Then, the controller 16B determines whether or not the current registration buffer number has exceeded a maximum number Nmax that can be registered for the speech recognition processor in question, in a step S39. If not, then control returns to the step S32. If exceeded, the controller 16B determines whether the processor number has exceeded a maximum speech recognition processor number Pmax or not in a step S40. If not exceeded, then control proceeds to a step S41.

In the step S41, the controller 16B sets the registration buffer number to 1 again. Thereafter, the processor number is incremented by 1 and the speech recognition processor corresponding to the processor number, e.g., the speech recognition processor 22-2, is enabled in a step S42.

If the processor number has exceeded the maximum speech recognition processor number Pmax in the step S40, the controller 16B sends a command to cancel the speech registration mode to the speech recognition circuit 15B, thereby canceling the speech registration mode in a step S43. Then, control goes back to the step S32.

If the speech recognition mode is indicated by the mode selector switch 13 in the step S34, then the controller 16B enables all the speech recognition processors in a step S44. Then, the controller 16B outputs a speech recognition command to the speech recognition circuit 15B in a step S45. The speech recognition processors 22-1 through 22-n in the speech recognition circuit 15B now effect a speech recognition process as described above in a step S46.

The controller 16B reads a status register (not shown) in the speech recognition circuit 15B to determine whether the speech recognition by the speech recognition processors 22-1 through 22-n is finished or not in a step S47. If the speech recognition is not yet finished, then the steps S46 and S47 are repeated until the speech recognition is finished. If the speech recognition is finished, then the controller 16 counts the number of speech recognition processors whose recognition results coincide in a step S48. The count is referred to as a processor count which is used as a level to determine the accuracy of recognition.

Then, the controller 16B determines whether the recognition result indicates an important operation or not in a step S49. If not, the controller 16B determines the accuracy of recognition, i.e., whether or not the processor count is equal to or greater than a predetermined second count in a step S50. The second count corresponds to a condition in which the same recognition result is obtained by more than half speech recognition processors, and represents a relatively low accuracy of recognition. If the processor count is lower than the second count, then since the input voice command cannot be recognized due to the low recognition accuracy, control goes to a step S54 for an error process. If the processor count is equal to or greater than the second count, then since the recognition accuracy is relatively high and the recognition process is reliable, the controller 16B produces a remote control instruction signal SR based on the recognized voice command data and sends the remote control instruction signal SR to the transmitting circuit 17 in a step S52.

If the recognition result indicates an important operation in the step S49, then the controller 16B determines whether or not the processor count is equal to or greater than a predetermined first count in order to determine the accuracy of recognition in a step S51. The first count represents a relatively high degree of recognition and corresponds to a condition in which the same recognition result is obtained using 90 percent or more of the speech recognition processors. For control commands of high importance, in order to maintain control reliability, no remote control signal RC is generated unless the condition of the step S51 is met.

The controller 16B produces a remote control instruction signal SR based on the recognized voice command data of high recognition accuracy and sends the remote control instruction signal SR to the transmitting circuit 17 in the step S52. In response to the remote control instruction signal SR, the transmitting circuit 17 transmits a corresponding remote control signal RC in a step S53.

If the processor count is lower than the second count in the step S50, or lower than the first count in the step S51, then the controller 16B effects an error process such as the generation of a buzzer sound in the step S54, and control goes back to the step S32.

In the second embodiment, an input voice command is recognized by the plural speech recognition processors 22-1 through 22-n based on their respective standard pattern data PA1 through PM1, PA2 through PM2, ... PAn through PMn. If the recognition result indicates an important operation, the accuracy of recognition is determined to lower the erroneous recognition rate.

Since the accuracy of recognition of a voice command which is of higher importance is confirmed, the recognition rate of the voice-operated remote control system is increased, and any trouble due to erroneous recognition is minimized.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A voice-operated remote control system comprising:

a microphone for entering a voice command;

speech recognition means for comparing a pattern of the entered voice command with a predetermined standard pattern to recognize contents of the voice command and for producing command data which corresponds thereto, said command data being representative of an operation to be carried out;

transmitting means for generating and transmitting a remote control signal corresponding to the command data;

degree-of-importance determining means for determining a degree of importance of said command data, including command data being representative of at least important operations and not important operations, and for producing a corresponding degree-of-importance signal; and recognition accuracy determining means for determining an accuracy of recognition of the command data depending on the corresponding degree of importance thereof as indicated by said degree-of-importance signal, and for sending to said transmitting means only command data that has been determined as being representative of important operation and having an accuracy of recognition exceeding a first predetermined threshold and for sending command data that has been determined as being representative of not important operations and having an accuracy of recognition exceeding a second predetermined threshold.

2. A voice-operated remote control system according to claim 1, wherein said recognition accuracy determining means has a predetermined threshold for determining the accuracy of recognition for each degree of importance determination of the operation corresponding to the command data.

3. A voice-operated remote control system according to claim 1, wherein said speech recognition means employs a plurality of standard patterns to be compared with one voice command, and said recognition accuracy determining means has a level for determining the accuracy of recognition, said level being represented by a number of standard patterns which substantially coincide with a pattern of a voice command entered through said microphone.

4. A voice-operated remote control system according to claim 3, wherein said speech recognition means comprises a memory for storing the standard patterns in respective storage areas thereof, and a speech recognition processor for reading the standard patterns corresponding to the entered voice command from said memory and recognizing the voice command based on the standard patterns read from said memory.

5. A voice-operated remote control system according to claim 3, wherein said speech recognition means comprises a plurality of memories for storing the standard patterns respectively, and a plurality of speech recognition processors, connected respectively to said memories, for reading the standard patterns corresponding to the entered voice command from said memory and recognizing the voice command based on the standard patterns read from said memory.

* * * * *